US007332850B2

(12) United States Patent
Ladabaum et al.

(10) Patent No.: US 7,332,850 B2
(45) Date of Patent: Feb. 19, 2008

(54) MICROFABRICATED ULTRASONIC TRANSDUCERS WITH CURVATURE AND METHOD FOR MAKING THE SAME

(75) Inventors: Igal Ladabaum, San Carlos, CA (US); Samuel H. Maslak, Woodside, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 127 days.

(21) Appl. No.: 10/367,112

(22) Filed: Feb. 10, 2003

(65) Prior Publication Data

US 2004/0000847 A1 Jan. 1, 2004

(51) Int. Cl.
*H01L 41/08* (2006.01)

(52) U.S. Cl. ...................................... 310/334; 310/335

(58) Field of Classification Search ................ 310/334, 310/335; 367/155, 157; 381/90, 114; 600/459
See application file for complete search history.

(56) References Cited

U.S. PATENT DOCUMENTS 3,971,250 A * 7/1976 Taylor ........................ 310/331
4,523,122 A * 6/1985 Tone et al. ................. 310/334
4,985,195 A * 1/1991 Wilson et al. .............. 264/320
4,992,692 A * 2/1991 Dias ........................... 310/335
5,172,024 A * 12/1992 Broussoux et al. .... 310/323.21
5,209,126 A * 5/1993 Grahn ................... 73/862.046
5,488,954 A * 2/1996 Sleva et al. ................. 600/459
5,569,968 A * 10/1996 Lal et al. ..................... 310/322
5,834,882 A * 11/1998 Bishop ....................... 310/359
5,844,349 A * 12/1998 Oakley et al. .............. 310/358
5,956,292 A * 9/1999 Bernstein ..................... 367/140
6,194,814 B1 * 2/2001 Hanafy et al. .............. 310/334
6,314,057 B1 * 11/2001 Solomon et al. ............ 367/174
6,323,580 B1 * 11/2001 Bernstein .................... 310/324
6,328,696 B1 * 12/2001 Fraser ........................ 600/459
6,492,762 B1 * 12/2002 Pant et al. .................. 310/334
6,515,402 B2 * 2/2003 Klee et al. .................. 310/324
6,632,178 B1 * 10/2003 Fraser ........................ 600/459
6,791,240 B2 * 9/2004 Mauchamp et al. ........ 310/334

* cited by examiner

*Primary Examiner*—Thanh Lam

(57) ABSTRACT

The present invention provides a microfabricated ultrasonic transducers with curvature. The curvature is made possible by thinning the substrate such that it is flexible enough to be mounted on an assembly with the desired curvature. In one aspect of the invention, the substrate can contain electronic circuits. In another aspect, the assembly mounting can incorporate curved damping materials that serve to remove undesirable substrate modes.

19 Claims, 6 Drawing Sheets

MICROFABRICATED ULTRASONIC TRANSDUCERS WITH CURVATURE AND METHOD FOR MAKING THE SAME

FIELD OF THE INVENTION

The present invention generally relates to the field of ultrasonic transducers. More specifically, the present invention capacitive microfabricated ultrasonic transducers having physical curvature.

BACKGROUND OF THE INVENTION

An acoustic transducer is an electronic device used to emit and receive sound waves. Ultrasonic transducers are acoustic transducers that operate at frequencies above 20 KHz, and more typically, in the 1-20 MHz range. Ultrasonic transducers are used in medical imaging, non-destructive evaluation, and other applications. The most common forms of ultrasonic transducers are piezoelectric transducers. In U.S. Pat. No. 6,271,620 entitled, "Acoustic Transducer and Method of Making the Same," issued Aug. 7, 2001, Ladabaum describes capacitive microfabricated transducers capable of competitive acoustic performance with piezoelectric transducers. Such transducers have advantages over piezoelectric transducers in the way that they are made and in the ways that they can be combined with controlling circuitry, as described in, for example, U.S. Pat. No. 6,246,158, issued Jun. 12, 2001 to Ladabaum.

The basic transduction element of the conventional microfabricated ultrasonic transducer is a vibrating capacitor. A substrate contains a lower electrode, a thin diaphragm is suspended over the substrate, and a metallization layer serves as an upper electrode. If a DC bias is applied across the lower and upper electrodes, an acoustic wave impinging on the diaphragm will set it in motion, and the variation of electrode separation caused by such motion results in an electrical signal. Conversely, if an AC signal is applied across the biased electrodes, the AC forcing function will set the diaphragm in motion, and this motion emits an acoustic wave in the medium of interest.

Microfabricated transducers are typically made on flat, rigid substrates, as required by microfabrication equipment. However, transducers with curvature are desirable in many applications. In fact, at least half of all practical medical ultrasound probes use curved transducer arrays. A typical range for the radius of curvature of an abdominal array is 4 to 6 cm, though trans-vaginal and other probes can have even smaller radii of curvature.

FIG. 1 illustrates the naming conventions of orientation and direction used in ultrasound engineering. As shown in FIG. 1, the transducer 100 is typically made up of multiple transducer elements 110. Each of the transducer elements 110 includes a plurality of individual transducer cells. The transducer elements 110 are oriented such that their lengths are along the elevation axis, and their widths are along the azimuth axis. The transducer elements 110 are adjacent to one another along the azimuth axis.

Physical curvature is desirable in diagnostic medical ultrasound to improve image field of view in the imaging plane as well as to provide for out-of-plane focusing (i.e., elevation beam-width control). It should be noted that the literature often refers to electronic delays as creating transducer curvature. But the real, physical curvature addressed herein is different than, and should not be confused with, this virtual, electronic curvature.

Currently, the most common forms of ultrasound imaging systems generate images by electronic scanning in either linear format or sector format. FIG. 2 illustrates the linear 210 and sector 220 image formats generated by a typical ultrasound system. As shown in FIG. 2, in linear format 210 scanning, time delays between transducer elements are used to focus the ultrasound beam in the image plane. Also shown in FIG. 2, in sector format 220 scanning, time delays between transducer elements are used both to focus the ultrasound beam and to steer it. Typically, the sector scan format 220 is used to image a relatively large, deep portion of the anatomy from a small acoustic window (e.g., imaging the heart); whereas the linear scan format 210 is used for optimum image quality near the face of the transducer (e.g., imaging the carotid). For a similar frequency range, the system and transducer requirements for sector scanning are more challenging than those required for linear scanning. In order to beam-steer, as is required in the sector format 220, the transducer elements of an imaging array need to be small enough to provide for an adequate acceptance angle, and cross-talk between channels needs to be kept to a minimum. In linear format 210, the restrictions on transducer dimensions, system and transducer cross-talk, and the dynamic range of the beam-former's timing are more relaxed.

Historically, the differences in these technological challenges led to the linear format 210 being preferred, if possible, over the sector format 220 by ultrasound system manufacturers. To provide the advantages of the sector format 220 field of view, but still maintain the system simplicity of the linear scan format 210, curvilinear transducers (i.e., linear transducers with convex curvature in the azimuth direction) were introduced in the art. The curvilinear transducers can be used in the linear scan format 210 for deep and wide scanning when a relatively large acoustic window is available (i.e., abdominal as opposed to cardiology imaging).

With the advent of digital beam-forming, system complexity is no longer the primary motivator for curved arrays; but physical curvature is nevertheless still desirable because it leads to superior image quality in a variety of applications. Note in FIG. 2 that there are significant regions 230, near the face of the transducer, where the sector format 220 does not interrogate. A curvilinear transducer would image this region. Thus, a curvilinear transducer employing the linear scan format is better suited for situations where both near field and wide angle fields of view are desirable. Furthermore, one would prefer to use the largest anatomically feasible aperture to form an image, while at the same time keeping system channel count to a reasonable number. Curvilinear transducers, because they do not need to beam-steer, are larger for a given channel count and field of view than sector transducers, and are thus able to produce higher quality images.

Curvilinear piezoelectric arrays are more difficult to assemble than conventional non-curved arrays because the piezoelectric ceramics are not flexible. Convex, piezoelectric, curvilinear arrays are disclosed in U.S. Pat. No. 4,344,327, issued Aug. 17, 1982 to Yoshikawa et al., and concave curvilinear arrays are disclosed in U.S. Pat. No. 4,281,550, issued Aug. 4, 1981 to Erikson. These patents teach methods of dicing and re-assembling piezoelectric arrays so that the advantage of performing sector fields of view is made possible without the need for electronic sector scanning techniques to steer the ultrasonic beams over large angles. Common to all of the teachings is a combination of dicing through the rigid transduction material and re-assembly methods such that the re-assembly of the diced elements into a curved structure is practical.

Furthermore, azimuth curvature is not the only desirable curvature of medical ultrasound probes. Elevation curvature is desirable to achieve elevation beam focus without the need of lossy lensing material. FIG. 3 illustrates elevation focusing as provided by a lens on a typical ultrasound probe. As shown in FIG. 3, typically, lensing material 120 is used to achieve the focus 130 of element 110A of transducer 100. U.S. Pat. No. 5,423,220, issued Jun. 13, 1995 to Finsterwald et al., teaches piezoelectric transducers with concave elevation curvature for focus and convex azimuth curvature. U.S. Pat. No. 5,415,175, issued May 16, 1995 to Hanafy et al., teaches, among other things, that piezoelectric transducer curvature in elevation is desirable to eliminate the generation of reflections from the face of the transducer that can lead to reverberation artifacts.

Physical curvature is also desirable in therapeutic ultrasound probes. Physical curvature focusing of the transducer could eliminate the necessity of electronic focus, which is challenging at the high power levels of therapeutic probes. Also, physical curvature focusing could eliminate the uses of focusing lenses, which are lossy and can generate excessive heating of the therapeutic probes.

Thus, it is desirable to provide for capacitive microfabricated ultrasonic transducers with curvature, such that the benefits and advantages of curvature, many already known and taught in the prior art for piezoelectric transducers, can be imparted to microfabricated transducers.

In co-pending U.S. patent application Ser. No. 09/435,324 filed Nov. 5, 1999, Ladabaum describes microfabricated transducers with polyimide structures on the front of the transducer and notches through the substrate to such walls in order to, among other things, make the transducer flexible. The teaching and structure in the '324 application describe a transducer that could have curvature in azimuth plane, though such a curved transducer is not specifically taught or claimed. Furthermore, it is not clear how such a method could provide for transducers with both elevation and azimuth curvature. Common to this and the cited piezoelectric prior art is that dicing is necessary for azimuth curvature. In the piezoelectric case, elevation curvature can be achieved either by dicing (i.e., Finsterwald) or by starting the transducer fabrication by providing for plano-concave (i.e., Hanafy) or otherwise rigidly formed and curved piezoelectric substrate. It is therefore desirable to have microfabricated transducer structures with concave or convex curvatures in azimuth, in elevation, or in both azimuth and elevation planes which can be easily formed.

It has been realized by the present inventors that a silicon substrate with microfabricated transducers on its surface, lapped or otherwise thinned to suitable dimensions can result in microfabricated ultrasonic transducer elements and arrays that are sufficiently flexible to create curved ultrasound probes.

In co-pending U.S. patent application Ser. No. 09/971,095 filed Oct. 19, 2000, Ladabaum et al. teach that substrate modes in the silicon substrate of microfabricated ultrasonic transducers exist, and that effective ways of damping such substrate modes include backing the transducer, thinning the transducer, and a combination of backing and thinning the transducer. U.S. Pat. No. 6,262,946, issued Jul. 17, 2001 to Khuri-Yakub et al., describes microfabricated ultrasonic transducers with substrate thinned such that the critical angle of a lamb wave mode is outside of the acceptance angle of interest. Neither Ladabaum nor Degertekin teach the flexible properties of a thin substrate or any application of thinning beyond that of substrate mode control and damping.

Flexible acoustic transducers are known in the art that are able to take curved shapes. Piezoelectric polymers, such as polyvinyl difluoride (PVDF) have been used for decades. The piezoelectric properties of such polymers, however, are not advantageous for conventional medical imaging, and thus have not been successfully applied to medical imaging. Canadian Patent No. 1,277,415, issued Dec. 4, 1990 to Clark et al., discloses an elastomeric electrostatic transducer that is flexible. However, this transducer is effective in the audible range, not at the ultrasonic frequency range of interest in medical ultrasound applications, and the techniques used in its fabrication cannot yield efficient transducers in the MHz range. For example, for useful ultrasonic transducers, vacuum gaps, not elastomeric structures with gas bubbles, are needed between the electrodes, and the gap dimensions needed for ultrasonic transducers are on the order of 0.1 um, far smaller than those taught in the Clark patent.

Thus, what is needed is a microfabricated ultrasonic transducer with acoustic performance in the MHz range, with physical curvature, and a simple and practical method of achieving such curvature. The present invention provides such a transducer.

SUMMARY OF THE INVENTION

The present invention describes microfabricated ultrasonic transducers, and arrays of microfabricated ultrasonic transducer elements, with physical curvature. Further the present invention describes capacitive microfabricated ultrasonic transducers (cMUT) with physical curvature that are compatible with monolithically integrated electronics. The cMUT of the present invention has physical curvature, yet does not have unwanted substrate modes.

The present invention achieves the above and other goals, either singly or in combination, by providing an assembly comprising parts. The first part is the microfabricated ultrasonic transducer (or array of transducer elements) which is formed on a silicon substrate subsequently thinned to dimensions such that the substrate is flexible. The silicon substrate can be bare or it can have integrated electronics. The second part is a supporting piece for the curved transducer. In one embodiment of the present invention, the supporting piece is a mounting piece with the desired curvature for mounting the transducer, or array of transducer elements. The mounting piece can be formed of suitable materials to absorb unwanted ultrasonic energy, such as spurious modes in the thinned transducer substrate. In another embodiment of the present invention, the supporting piece is not a mounting piece, but rather is created by pouring curable filler material onto the non-radiating surface of the thinned transducer, which has adopted the desired curvature by suitable fixturing means. Such filler material can be formulated to absorb unwanted ultrasonic energy.

BRIEF DESCRIPTION OF THE DRAWINGS

The present invention will become more apparent from the detailed description set forth below when taken in conjunction with the drawings in which like reference characters identify corresponding items throughout and wherein.

DETAILED DESCRIPTION

The present invention will now be described in detail with reference to the drawings, which are provided as illustrative examples of the invention so as to enable those skilled in the art to practice the invention. Notably, the figures and examples discussed below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components that are, by way of illustration, referred to herein.

Figure 1:
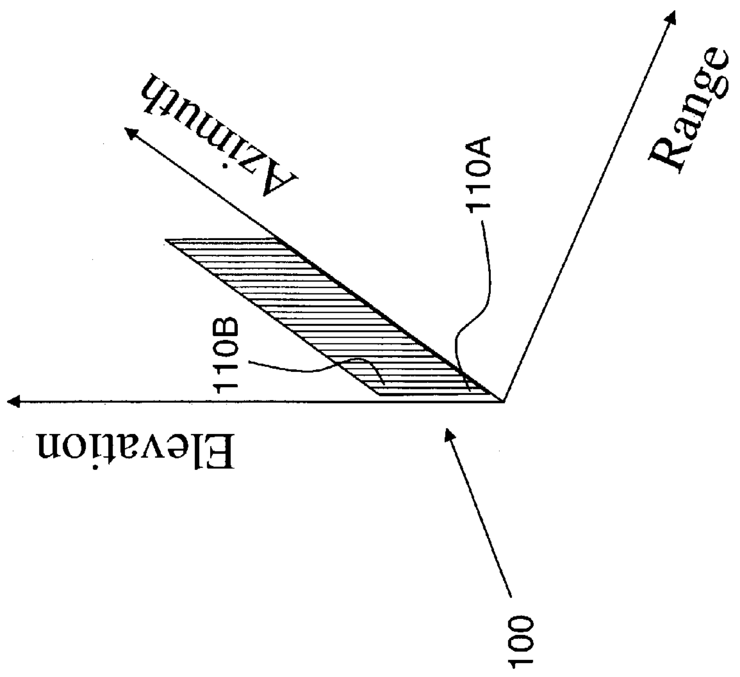
FIG. 1 (Prior Art)
FIG. 1 illustrates a typical medical ultrasonic transducer probe and defines the azimuth, elevation, and range directions.
Figure 2:
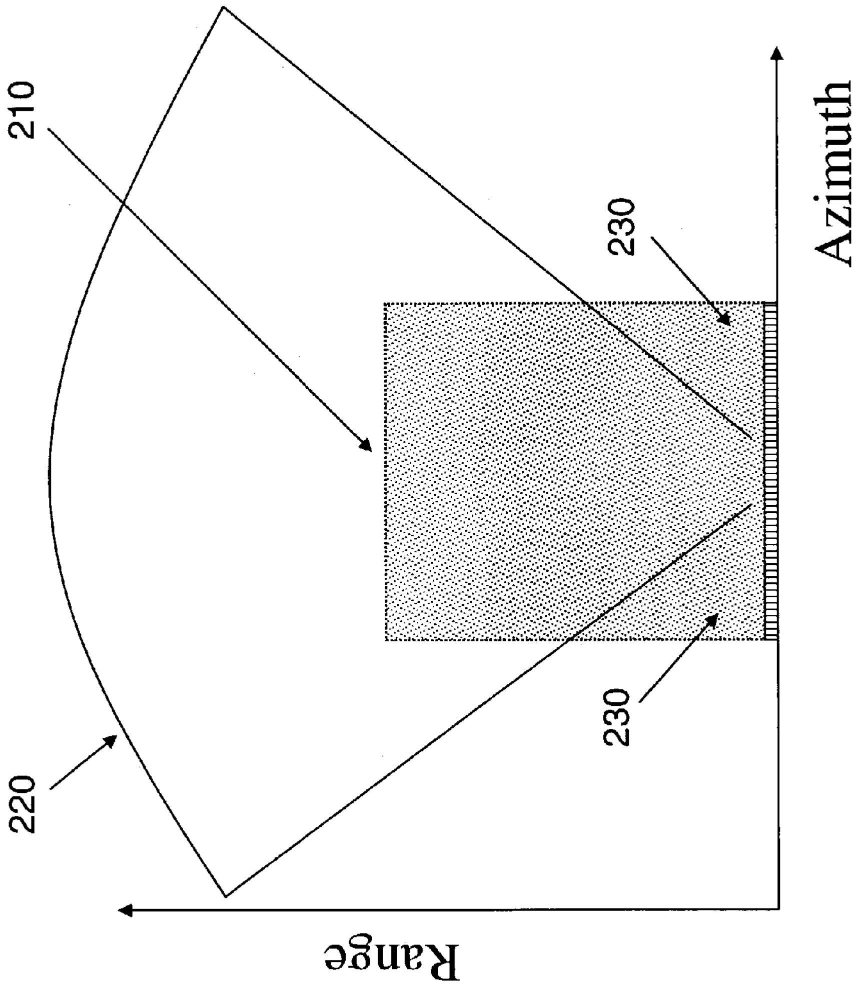
FIG. 2 (Prior Art)
FIG. 2 illustrates the sector and linear image formats generated by a typical ultrasound system.
Figure 3:
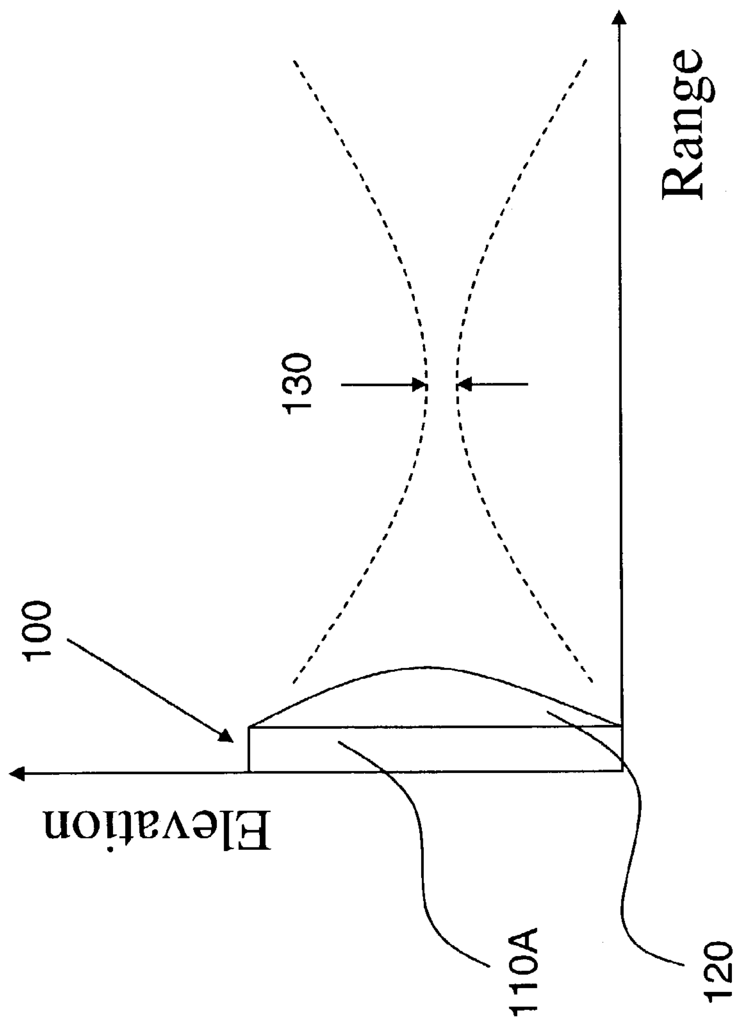
FIG. 3 (Prior Art)
FIG. 3 illustrates elevation focusing as provided by a lens on a typical ultrasound probe.
Figure 4:
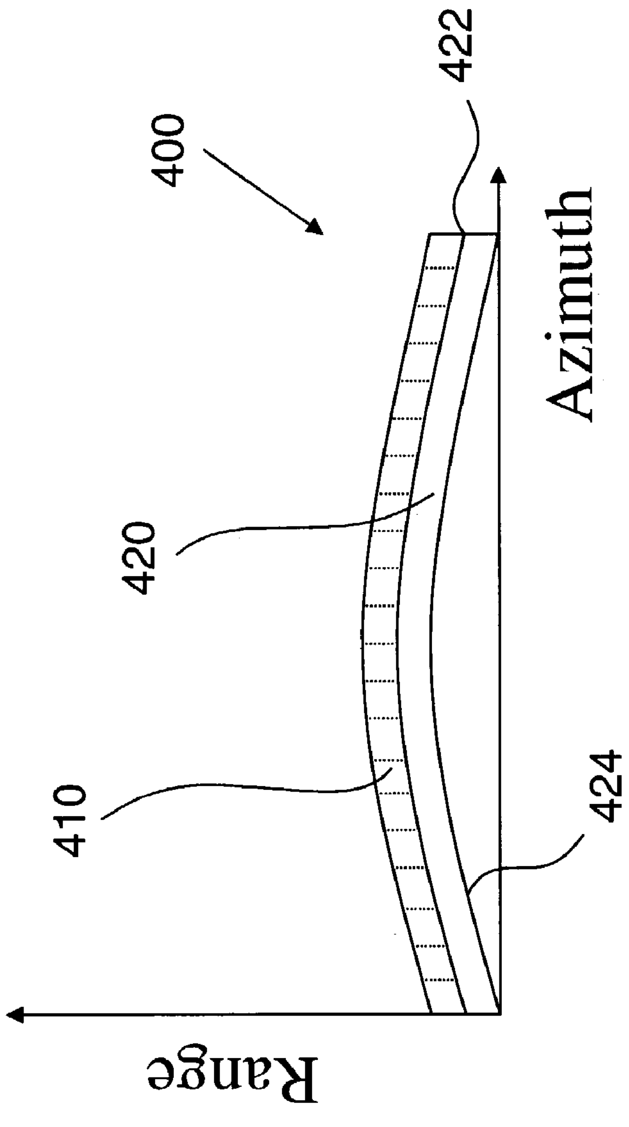
FIG. 4 illustrates a cross-sectional view of a curved microfabricated ultrasonic transducer according to an embodiment of the present invention.
Figure 5:
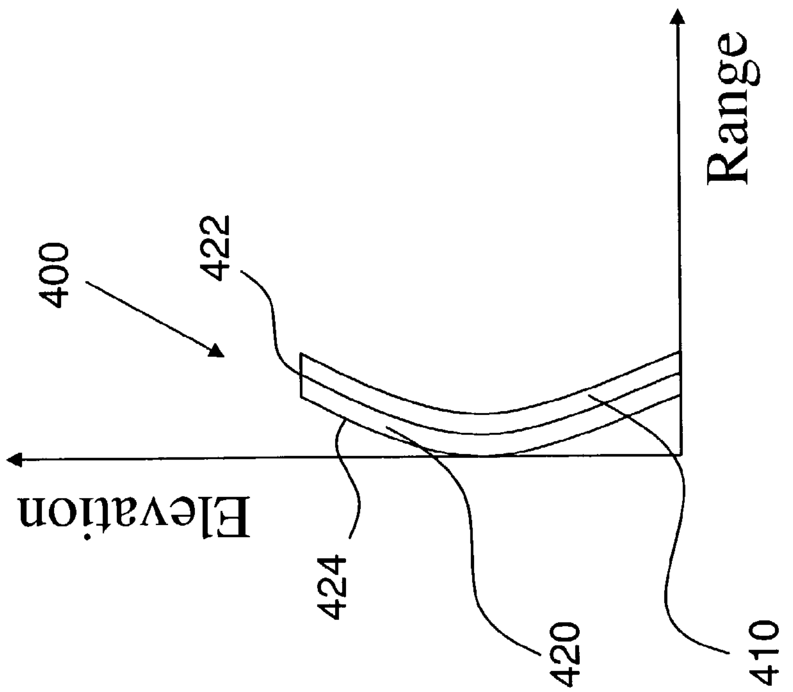
FIG. 5 illustrates a cross-sectional view of a curved microfabricated ultrasonic transducer according to an embodiment of the present invention.

FIG. 4 and FIG. 5 show cross-sectional views of exemplary embodiments of the present invention. As shown in FIG. 4 and FIG. 5, the transducer assembly 400 has physical curvature along the azimuth and elevation directions (i.e., compound curvature). This curvature is shown to be convex in the azimuth direction (FIG. 4) and concave in the elevation direction (FIG. 5). It will be apparent to those skilled in the art that either one or both of these curvatures might be convex or concave, or that either one of these curvatures might be eliminated altogether. Further, the definition of elevation and azimuth implies a rectangular orientation and symmetry to the transducer, which in the case of annular arrays or 2-D transducer matrices might not be relevant. Thus, other embodiments of the present invention include curvatures with circular symmetry, as well as curvatures with no symmetry and other equivalent structures where the radiating and receiving surface of the transducer is not planar.

As shown in FIG. 4 and FIG. 5, the transducer assembly 400 of this exemplary embodiment is composed of two basic parts. The first part is the flexible capacitive microfabricated transducer (cMUT) 410 and the second is the curved backing 420. The curved backing 420 is depicted as curved along both its major surfaces, the contact surface 422 and the outer surface 424, for emphasis; but it will be clear to those skilled in the art that only the contact surface 422 need have curvature. The curved backing 420 could have a planar outer surface and a curved contact surface. The dashed segments of cMUT 410 in FIG. 4 demonstrate separate elements of an array embodiment of the present invention that includes multiple transducer elements. The remaining description of the present invention focuses on the flexible cMUT 410, the curved backing 420, and the manner of affixing one to the other at the contact surface 422.

The process of making the flexible cMUT begins with a silicon support substrate on whose top surface cMUTs have been fabricated by a series of depositions, lithography steps, and etches. The cMUTs can be similar to, and made in a similar manner to, those disclosed in U.S. Pat. No. 6,271,620, issued on Aug. 7, 2001 to Ladabaum. The silicon substrate can be bare, or it can have integrated electronics, for example, as disclosed in U.S. Pat. No. 6,246,158, issued on Jun. 12, 2001 to Ladabaum. The maximum distance that cMUT structures typically extend beyond the substrate's top surface is between 1 and 5 microns. In the case where the silicon substrate contains integrated electronics, these are typically formed within the top 10 microns of the substrate, with some specialized high voltage processes on insulators requiring up to 20 microns.

Typically, the substrate with the formed cMUTs is in the form of a standard semiconductor wafer, for example 4, 5, 6, or 8 inches in diameter. This wafer contains at least one transducer, but typically contains many individual transducer array dies. Next, the wafer substrate is thinned by any of several potential means to a suitable dimension such that each cMUT, when complete, is flexible. The substrate can be thinned by lapping, for example. When lapping, the cMUT surface of the wafer can be pressed against the holder with protective wax as an interposing layer, as is known in the art, and the back of the wafer is lapped as is known in the art. The substrate can also be thinned by other means, such as reactive ion etching or wet etching (i.e., KOH or TMAH), as is practiced in the art.

The wafer substrate is thinned to a range of approximately 50-150 microns so that it is flexible enough to achieve an individual cMUT radius of curvature of at least 3 cm. With careful handling, though, cMUT radii of curvature of between approximately 15 mm to 60 mm are possible. The thinned wafer, which typically contains a plurality of transducer arrays, is then diced or etched to yield separate transducer arrays. Optionally, the transducer arrays can be cut or etched from the wafer prior to the thinning process, and individual transducer arrays can be lapped or etched to achieve the desired thickness.

In one aspect of the present invention, it is advantageous, in order to form transducers of compound curvature, to dice or at least partially dice or otherwise etch the silicon in between array elements such that compound curvature can be achieved.

In an embodiment of the present invention, flexible transducer array die are produced. These flexible cMUT die typically have bonding pads for all electrical connections formed on the same surface as the cMUTs, though cMUTs with through-wafer vias, such as disclosed in U.S. Pat. No. 6,430,109, issued on Aug. 6, 2002 to Khuri-Yakub et al., can be compatible with the lapping process herein described.

Each thinned, flexible cMUT transducer die of the present invention can then be pressed against a curved backing. The curved backing is preferably made of a material of similar acoustic impedance to that of silicon, but very lossy, so that it can absorb any ultrasound energy in the silicon substrate of the thinned die and thus damp undesired substrate modes. The backing need not necessarily be acoustically matched and lossy provided that the substrate modes at the thinned dimensions are outside the frequency range or radiation angle of interest.

In an embodiment of the present invention, a curved backing with an acoustic impedance similar to that of silicon and which is very lossy can be formed, for example, by designing a mold with the desired curvature and pouring an epoxy-tungsten mixture in the mold. In this embodiment, the epoxy-tungsten is a 20-1 weight mixture of 20 um spherical tungsten powder and epoxy. However, other mixtures will be apparent to those skilled in the art. The mold and mixture are then allowed to cure and outgas in, for example, a rough vacuum oven at 50 degrees Celsius.

The resulting backing piece can then be placed on a holder and coated with a thin film of adhesive. This thin adhesive film is, for example, no greater than one micron. The flexible transducer is pressed onto the curved backing. Tooling with complimentary curvature to that of the backing can be designed to ensure a good bond between the backing and the silicon. The tooling is designed such that pressure can be applied at one edge of the flexible transducer and then rocked so that the transducer makes contact with the backing with only the thin film of adhesive by displacing any air bubbles or adhesive agglomeration with the rocking motion. The complimentary tooling can rest in place until the adhesive has completely cured.

Adhesives need to be carefully chosen for compatibility with the eventual temperature profile and environment of the transducer probe. For example, cyanoacrylate is useful for only small temperature ranges and insulating packaging, but the curing process occurs at room temperature and within minutes. Epoxy mixtures have excellent adhesive properties, but are not ideal in absorbing the stresses caused by differences in coefficients of thermal expansion of the backing and the transducer over large temperature profiles. Silicon adhesives are more compliant and useful for stress relief.

Figure 6:
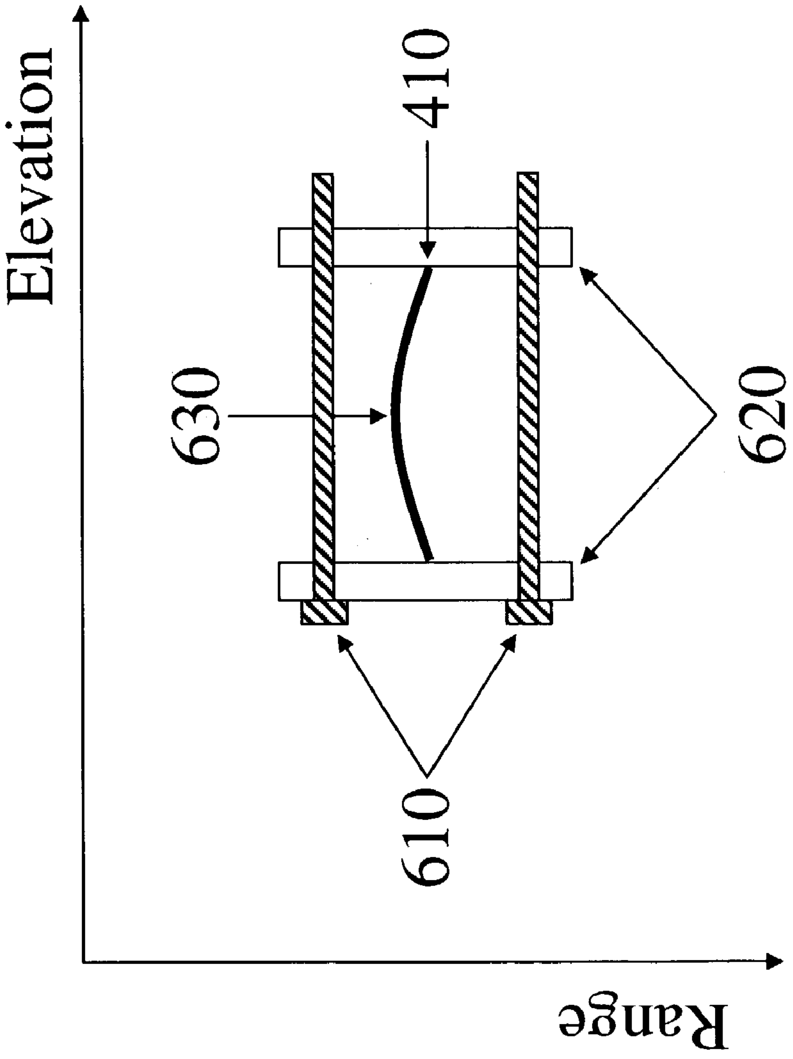
FIG. 6 illustrates a compression jig used to apply curvature to a thinned ultrasonic transducer according to an embodiment of the present invention.

In another exemplary embodiment, the flexible array is not mounted on a curved backing, but rather is itself curved by a fixturing means and the backing material poured into the fixture and cured. An advantage of such curving of the flexible transducer is that very precise curvatures may be achieved by the fixturing means. For high frequency transducers, for example, with concave elevation curvature, achieving the correct curvature in a mold can be very challenging. Instead, a simple compression jig can be used. FIG. 6 illustrates such a simple compression jig. As shown in FIG. 6, the compression plates 620 are adjusted by turning the threaded screws 610 until the transducer 410 obtains the desired radius of curvature. A suitable support filler material, as described above, can then be poured and cured directly on the non-radiating surface 630 of the transducer 410.

In a further embodiment of the present invention, electrical connections can be made to the appropriate bonding pads on the front surface of the flexible transducer assembly. These electrical connections can be made with conventional wire bonds, or flexible circuit attachments, or other known conductive attachment methods, such as conductive epoxy. Alternately, electrical connections can be made prior to curving the flexible transducer, when it is in its thinned and planar state and it is easy to connect flexible circuitry to the bond pads with a hot-bar bonder, for example, as is known in the art. The curved cMUT assembly is thus ready to be incorporated into a transducer probe.

Although the present invention has been particularly described with reference to the preferred embodiments thereof, it should be readily apparent to those of ordinary skill in the art that changes and modifications in the form and details thereof may be made without departing from the spirit and scope of the invention. For example, those skilled in the art will understand that while currently commonly available semiconductor fabrication equipment requires a flat, relatively thick wafer, techniques are being developed and could be in practice such that lithography on a curved surface is practical. Thus, even though an exemplary sequence of fabrication is described for silicon semiconductor, different sequences can arrive at a curved cMUT structure. Additionally, although elevation curvature has been described with reference to the fixturing means for obtaining transducer curvature, it will be apparent to those skilled in the art that other fixturing means for other curvatures are possible. For example, fixturing means where a homogeneous disk transducer's perimeter is constrained by a cylindrical tightener will adopt spherical curvature. It is intended that the appended claims include such changes and modifications.

What is claimed is:

1. A transducer assembly, comprising:

a microfabricated ultrasonic transducer (MUT) device formed on a thin substrate, wherein the thin substrate allows the MUT device to achieve a required curvature for a predefined application; and a backing, wherein the backing is disposed against the thin substrate to result in the MUT device maintaining the required curvature;

wherein the MUT device comprises a plurality of elements each element comprising a capacitive MUT having a diaphragm suspended over the thin substrate, a lower electrode with the substrate, and an upper electrode on the diaphragm operable to move so as to vary a distance between the upper and lower electrodes.

2. The transducer assembly of claim 1, wherein the MUT device is a single transducer element.

3. The transducer assembly of claim 1, wherein the MUT device is a transducer array having a plurality of transducer elements.

4. The transducer assembly of claim 1, wherein the thin substrate is bare silicon.

5. The transducer assembly of claim 1, wherein the thin substrate is silicon with integrated electronics.

6. The transducer assembly of claim 1, wherein the thin substrate has a thickness of between 25 microns and 150 microns.

7. The transducer assembly of claim 6, wherein the thickness is between 50 microns and 100 microns.

8. The transducer assembly of claim 1, wherein the required curvature has a radius of curvature in an azimuth direction.

9. The transducer assembly of claim 8, further comprising a lens, used for focusing in an elevation direction, disposed against a radiating and receiving surface of the MUT device.

10. The transducer assembly of claim 1, wherein the required curvature has a radius of curvature in an elevation direction.

11. The transducer assembly of claim 1, wherein the required curvature has a radii of curvature in an azimuth and an elevation direction.

12. The transducer assembly of claim 11, wherein the required curvature is spherical.

13. The transducer assembly of claim 11, wherein the required curvature is parabolic.

14. The transducer assembly of claim 1, wherein the required curvature has a radius of curvature of between 15 mm and 60 mm.

15. The transducer assembly of claim 1, wherein the backing is a damping material that absorbs spurious ultrasonic energy.

16. The transducer assembly of claim 15, wherein the damping material is lossy and has an impedance that matches an impedance of the thin substrate.

17. The transducer assembly of claim 1, further comprising a lens disposed against a radiating and receiving surface of the MUT device.

18. The transducer assembly of claim 1, further comprising an adhesive layer between the backing and the thin substrate used to affix the backing to the thin substrate.

19. The transducer assembly of claim 18, wherein the adhesive layer has a thickness of less than 1 micron.

* * * * *